United States Patent
Akino (10) Patent No.: US 8,704,385 B2
(45) Date of Patent: Apr. 22, 2014

(54) SEMICONDUCTOR DEVICE HAVING PAD REGION FOR WIRE-BONDING AND METHOD OF MANUFACTURING THE SEMICONDUCTOR DEVICE

(75) Inventor: Masaru Akino, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 13/428,157

(22) Filed: Mar. 23, 2012

(65) Prior Publication Data
US 2012/0248618 A1  Oct. 4, 2012

(30) Foreign Application Priority Data

Mar. 29, 2011 (JP) ................................ 2011-072735
Jan. 25, 2012 (JP) ................................ 2012-012994

(51) Int. Cl.
*H01L 23/48* (2006.01)
*H01L 23/52* (2006.01)
*H01L 29/40* (2006.01)

(52) U.S. Cl.
USPC ............ 257/784; 257/690; 257/781; 438/612

(58) Field of Classification Search
USPC ......... 257/773, 774, 779, 780, 781, 784, 786, 257/758, 734, 643, 640, 684, 698, 737, 738, 257/878, 778, 690; 438/118, 612, 613, 614, 438/617, 618, 622, 597
See application file for complete search history.

(56) References Cited

U.S. PATENT DOCUMENTS

2006/0160263 A1* 7/2006 Tomisaka et al. ............... 438/50
2009/0166893 A1* 7/2009 Okumura et al. ............. 257/784

FOREIGN PATENT DOCUMENTS

JP         03049231        3/1991

* cited by examiner

*Primary Examiner* — Thanh Y Tran
(74) *Attorney, Agent, or Firm* — Adams & Wilks (57) ABSTRACT

A semiconductor device has a semiconductor substrate, an insulating film disposed on a surface of the semiconductor substrate, and a porous metal film disposed on the insulating film and having a void region containing voids and a void-free region that does not contain any voids. A protective film is disposed on the porous metal film and has an opening portion defining a pad region having a pad opening end. An interface between the void region and the void-free region of the porous metal film is disposed at one of the pad opening end and a position outside of the pad opening end. A wire is wire-bonded to the porous metal film in the pad region.

18 Claims, 11 Drawing Sheets

PRIOR ART

SEMICONDUCTOR DEVICE HAVING PAD REGION FOR WIRE-BONDING AND METHOD OF MANUFACTURING THE SEMICONDUCTOR DEVICE

BACKGROUND OF THE INVENTION

1. Field of the Invention

The present invention relates to a semiconductor device having a pad used in wire-bonding and a method of manufacturing the semiconductor device.

2. Description of the Related Art

Figure 9:
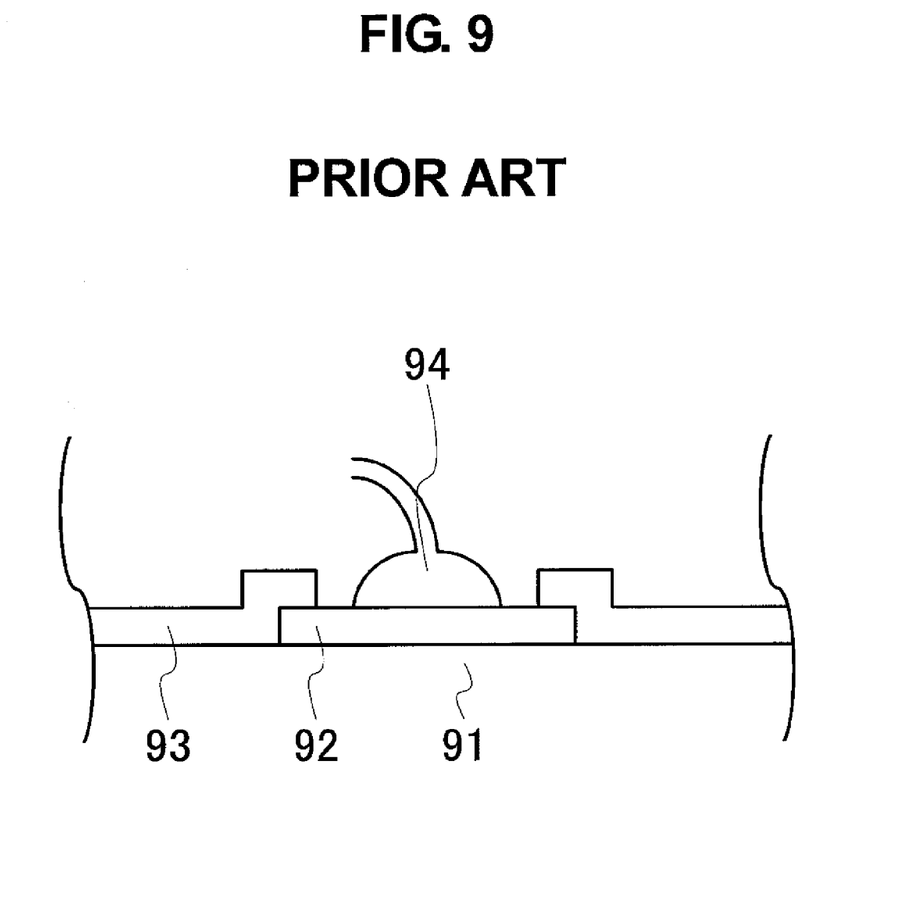
FIG. 9 is a sectional view illustrating a conventional semiconductor device.

A conventional semiconductor device having a pad is described. FIG. 9 illustrates a sectional view of a pad portion of the conventional semiconductor device. In this example, an opening portion of a protective film 93 on an uppermost metal film 92, which is provided on an upper surface of an insulating film 91, is defined as the pad. A wire 94 is connected to the pad by wire-bonding (for example, see Japanese Published Patent Application No. 03-049231).

However there has been a risk that in a conventional semiconductor device having a pad, due to the stress generated by the impact of wire-bonding, cracks might be found in the pad made of the metal film 92 or in the insulating film 91 under the pad, which has also been a problem.

SUMMARY OF THE INVENTION

The present invention has been made to solve the above-mentioned problem, and has an object to provide a semiconductor device having a pad, which has a structure in which cracks are less liable to appear due to wire-bonding, and to provide a method of manufacturing the semiconductor device.

In order to solve the above-mentioned problem, the present invention provides a semiconductor device, including: a semiconductor substrate; an insulating film provided on a surface of the semiconductor substrate; a porous metal film provided on the insulating film; a protective film provided on the porous metal film, and having an opening portion, which defines a pad region, provided therein; and a wire, which is wire-bonded to the opening portion.

Further, in order to solve the above-mentioned problem, the present invention provides a method of manufacturing a semiconductor device, including: providing an insulating film on a surface of a semiconductor substrate; selectively providing a porous metal film on the insulating film; providing a protective film on the porous metal film; providing an opening portion, which defines a pad region, in the protective film on the porous metal film; and bonding a wire with respect to the opening portion.

According to the present invention, the stress generated by the impact of wire-bonding is mostly absorbed in the porous metal film owing to the distortion of the porous metal film. Accordingly, it is possible to prevent the generation of the cracks in the insulating film provided under the porous metal film due to the stress generated by this impact.

DETAILED DESCRIPTION OF THE PREFERRED EMBODIMENT

Hereinafter, an embodiment of the present invention is described with reference to the drawings.

Figure 1:
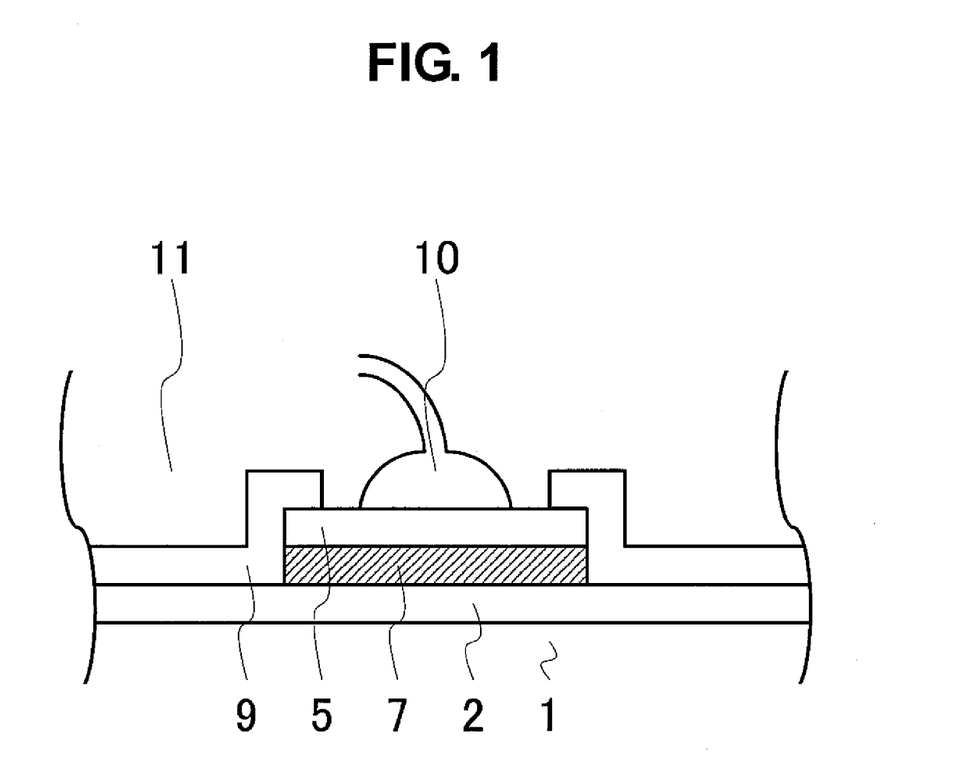
FIG. 1 is a sectional view illustrating a semiconductor device.

First, a structure of a semiconductor device is described. FIG. 1 is a sectional view illustrating the semiconductor device according to the embodiment of the present invention. The semiconductor device of this embodiment includes a semiconductor substrate 1, an insulating film 2, a porous metal film 7, a metal film 5, a protective film 9, a wire 10, and an encapsulation resin 11.

The insulating film 2 is provided on a surface of the semiconductor substrate 1, and the porous metal film 7 is selectively provided on a part of a surface of the insulating film 2. The metal film 5 is provided on the porous metal film 7, and the protective film 9 is provided on the metal film 5. Then, an opening portion is provided in the protective film 9 so that a part of a surface of the metal film 5 is exposed. The opening portion of the protective film 9 defines a pad region. The wire 10 is connected to the pad region by wire-bonding. After that, the semiconductor device is sealed with the encapsulation resin 11.

Next, with reference to FIGS. 2A to 2D, a method of manufacturing the semiconductor device using a porous metal film is described. FIGS. 2A to 2D are schematic sectional views illustrating the method of manufacturing the semiconductor device.

Figure 2A:
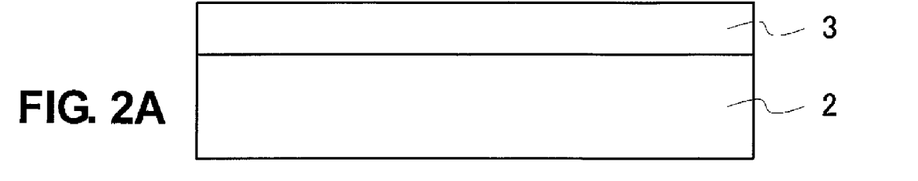
FIGS. 2A to 2D are sectional views illustrating a method of manufacturing the semiconductor device.
Figure 2B:
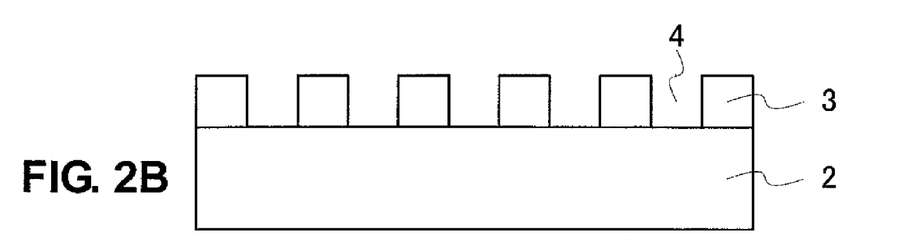

As illustrated in FIG. 2A, a metal film 3 is formed on the insulating film 2 by sputtering. A resist (not shown) is applied onto the metal film 3, and through exposure and development, the resist is selectively left unremoved. With use of the resist as a mask, the metal film 3 is subjected to etching through the thickness of the metal film 3, and as illustrated in FIG. 2B, a trench 4 is formed in the metal film 3. After that, the resist is removed.

Figure 2C:
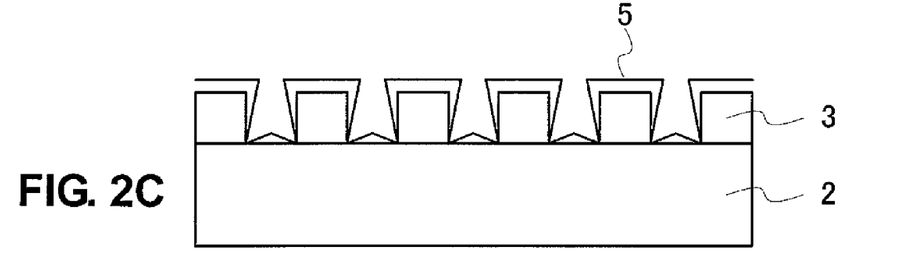

The surface of the semiconductor device is then subjected to etching up to the depth of about 200 Å to remove an oxide film. Next, as illustrated in FIG. 2C, the metal film 5 is formed by sputtering on the metal film 3 having the trench 4. At this time, the metal film 5 is formed so as to be thicker in an upper portion of the trench 4 than in a lower portion thereof.

Figure 2D:
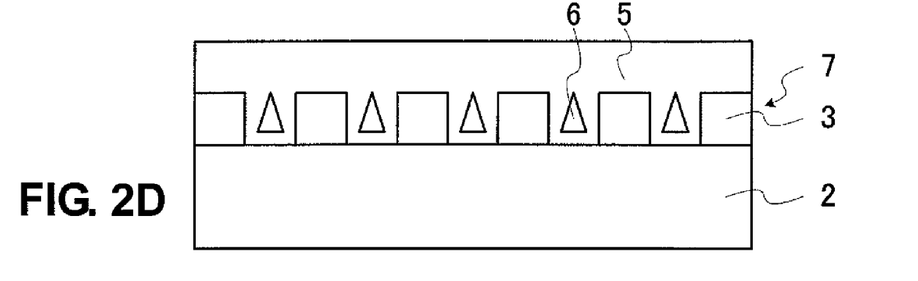

As illustrated in FIG. 2D, the metal film 5 including voids 6 is filled in the trench 4. In this manner, the porous metal film 7 is formed, and the metal film 5 is formed thereon.

Next, an influence of a stress to be generated by the impact of wire-bonding to the semiconductor device is described.

When the wire-bonding is performed with respect to the pad, from an impact point of the wire-bonding as a center, due to the stress generated by the impact, although not shown, the plurality of voids 6 in the porous metal film 7 are crushed in a direction according to the impact of the wire-bonding. Thus, the porous metal film 7 is distorted. At this time, owing to the distortion of the porous metal film 7, the generated stress is mostly absorbed in the porous metal film 7. Meanwhile, the bonding surface between the porous metal film 7 and the insulating film 2 is hardly distorted, and hence the impact of wire-bonding hardly influences the insulating film 2. That is, the cracks are less liable to be generated in the insulating film 2 due to the stress generated by the impact of the wire-bonding.

[Effect] In this manner, the stress generated by the impact of the wire-bonding is mostly absorbed in the porous metal film 7 owing to the distortion of the porous metal film 7. Accordingly, the cracks are less liable to appear in the insulating film 2 under

Figure 3:
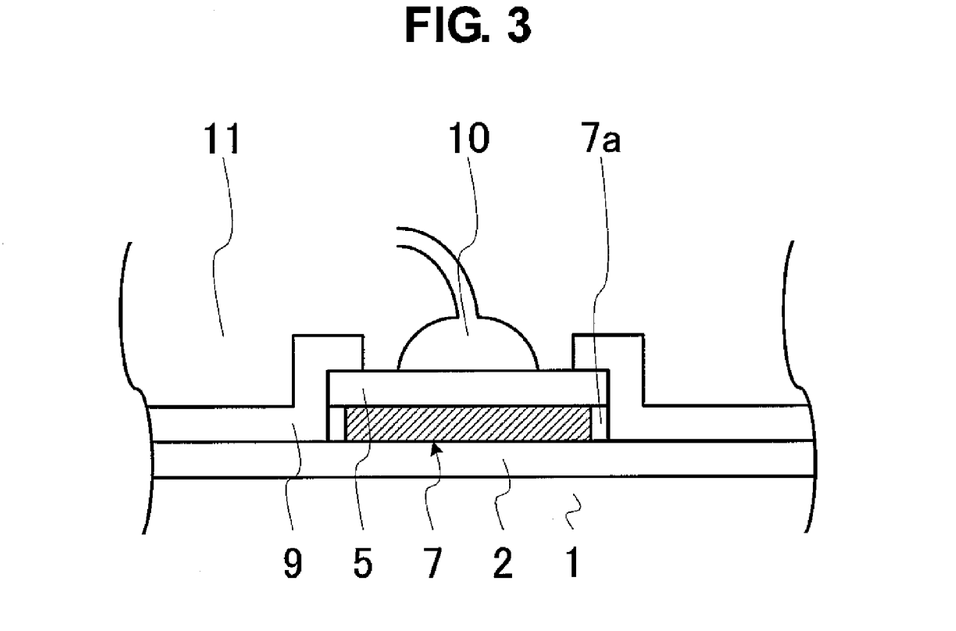
FIG. 3 is a sectional view illustrating a semiconductor device.

[Modification 1] Use of an appropriately changed mask for the formation of a resist pattern which determines the shape in FIG. 2B can selectively provide a void-free region 7a without the trench 4 and the voids 6 to the porous metal film 7 with a void region including the trench 4 and the voids 6 as illustrated in FIG. 3. The void-free region 7a is provided so as to cover a side surface of the porous metal film 7, and an interface between the void region and the void-free region 7a is positioned at a pad opening end or positioned outside relative to the pad opening end. That is, the void-free region 7a is formed to have a thickness in the semiconductor substrate direction of FIG. 3 equivalent to an overlapping amount of the protective equivalent to an overlapping amount of the protective film 9 and the metal film 5, or a thickness smaller than the overlapping amount. By this construction, in a step of forming the protective film 9 in a semiconductor manufacturing process, the voids 6 are not exposed owing to the presence of the void-free region 7a, and hence inner portions of the voids 6 are not contaminated. Further, the porous metal film 7 is present at least below the pad region, and hence similarly to the semiconductor device of FIG. 1, the cracks are less liable to be generated in the insulating film 2 under the porous metal film 7.

Figure 4:
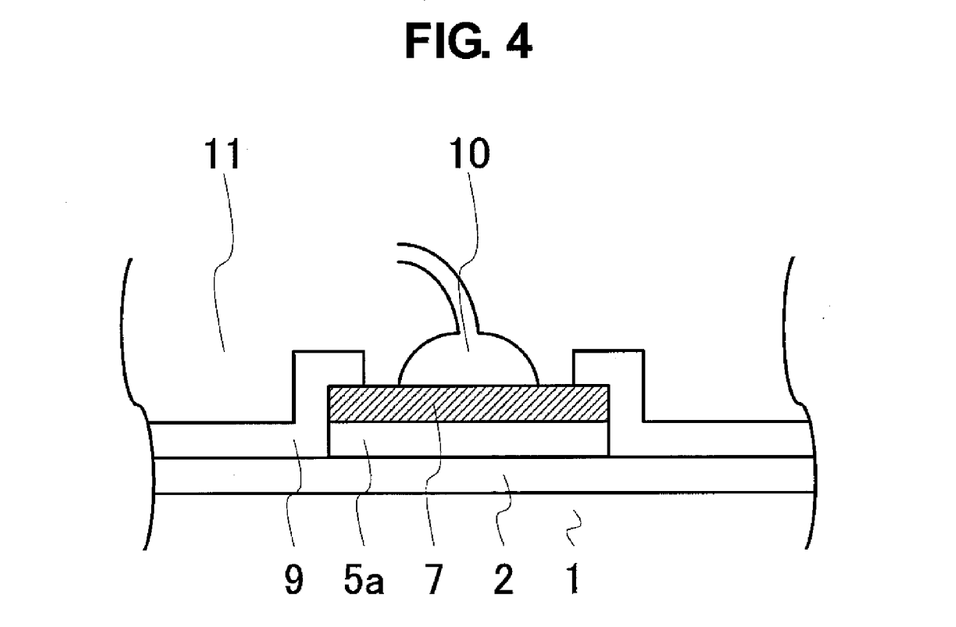
FIG. 4 is a sectional view illustrating a semiconductor device.

[Modification 2] As illustrated in FIG. 4, the porous metal film 7 in which the entire metal film 5 of FIG. 20 has been etched can be provided on a metal film 5a.

Figure 5:
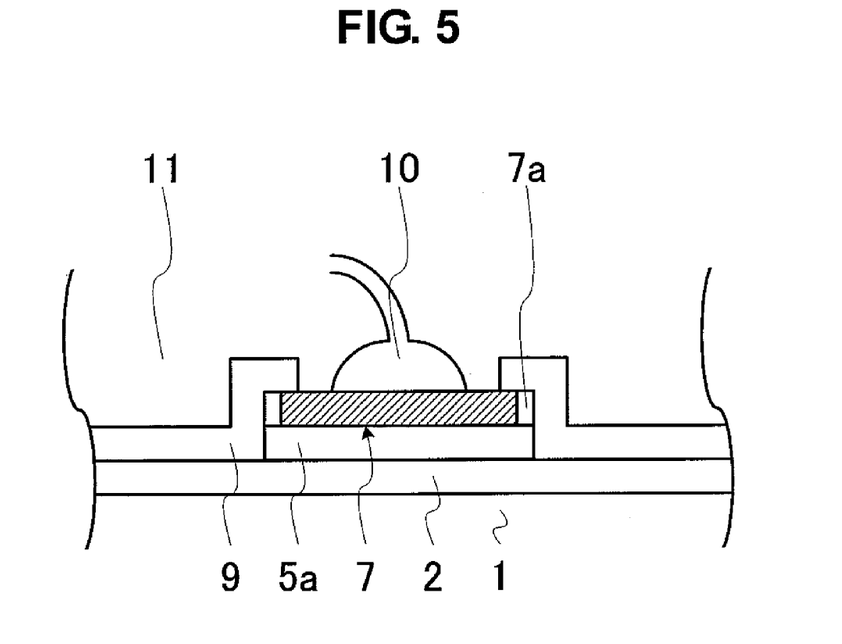
FIG. 5 is a sectional view illustrating a semiconductor device.

[Modification 3] As illustrated in FIG. 5, the void-free region 7a may be further provided to the semiconductor device of FIG. 4.

Figure 6:
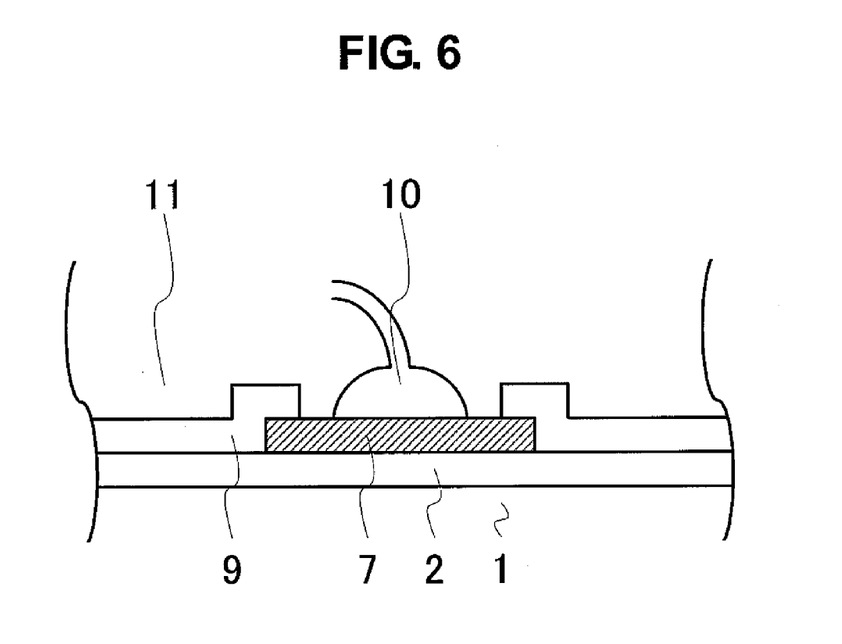
FIG. 6 is a sectional view illustrating a semiconductor device.

[Modification 4] As illustrated in FIG. 6, the porous metal film 7 in which the entire metal film 5 of FIG. 2D has been etched can be provided on the insulating film 2.

Figure 7:
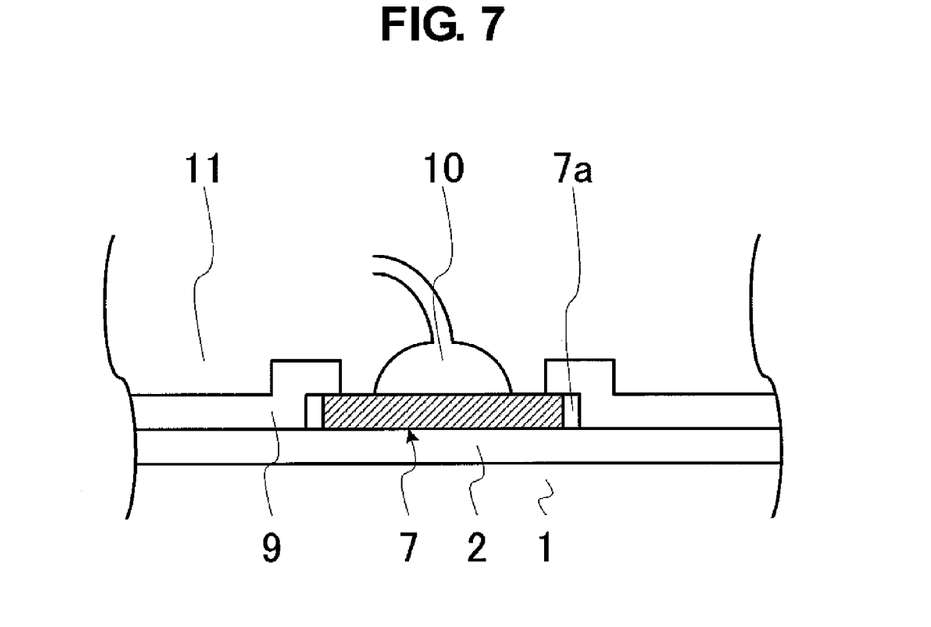
FIG. 7 is a sectional view illustrating a semiconductor device.

[Modification 5] As illustrated in FIG. 7, the void-free region 7a may be further provided to the semiconductor device of FIG. 6.

Figure 8:
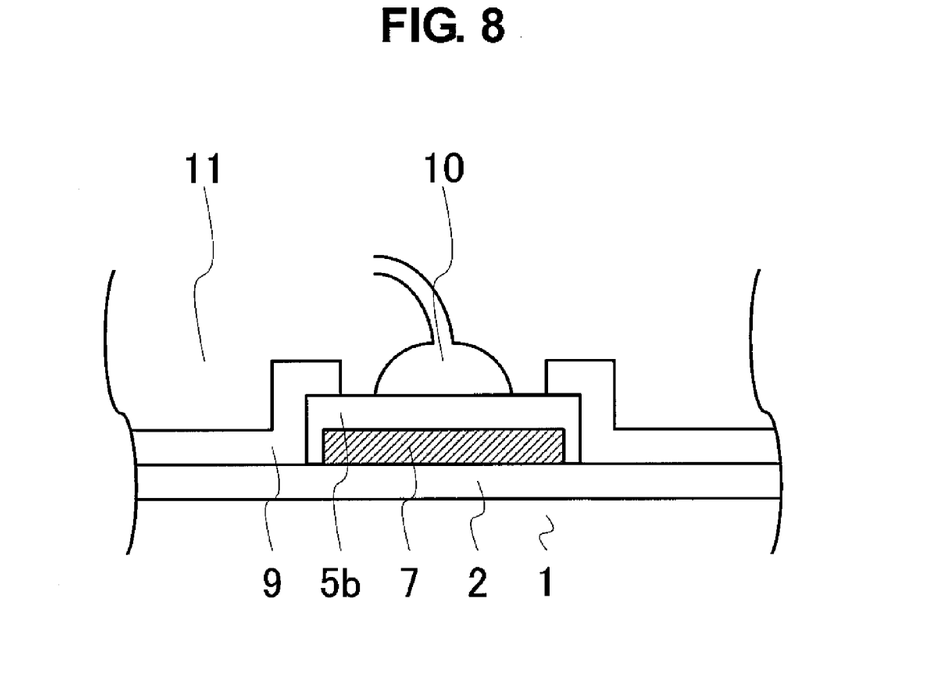
FIG. 8 is a sectional view illustrating a semiconductor device.

[Modification 6] As illustrated in FIG. 8, in the semiconductor device of FIG. 1, a region of a metal film 5b can be formed larger than the region of the porous metal film 7.

[Modification 7] In FIG. 2B, the metal film 3 is subjected to etching through the thickness of the metal film 3. Although not shown, the metal film 3 may be subjected to etching by an amount smaller than the thickness of the metal film 3.

[Modification 8] Although not shown, the porous metal film 7 can be manufactured through formation of a metal film under a state in which an angle between a target used in sputtering and the semiconductor wafer is set to 30° to 80°, and a gas pressure of an argon gas used in the sputtering is set to 2 Pa to 3 Pa, which is higher than that in a usual case.

Figure 10:
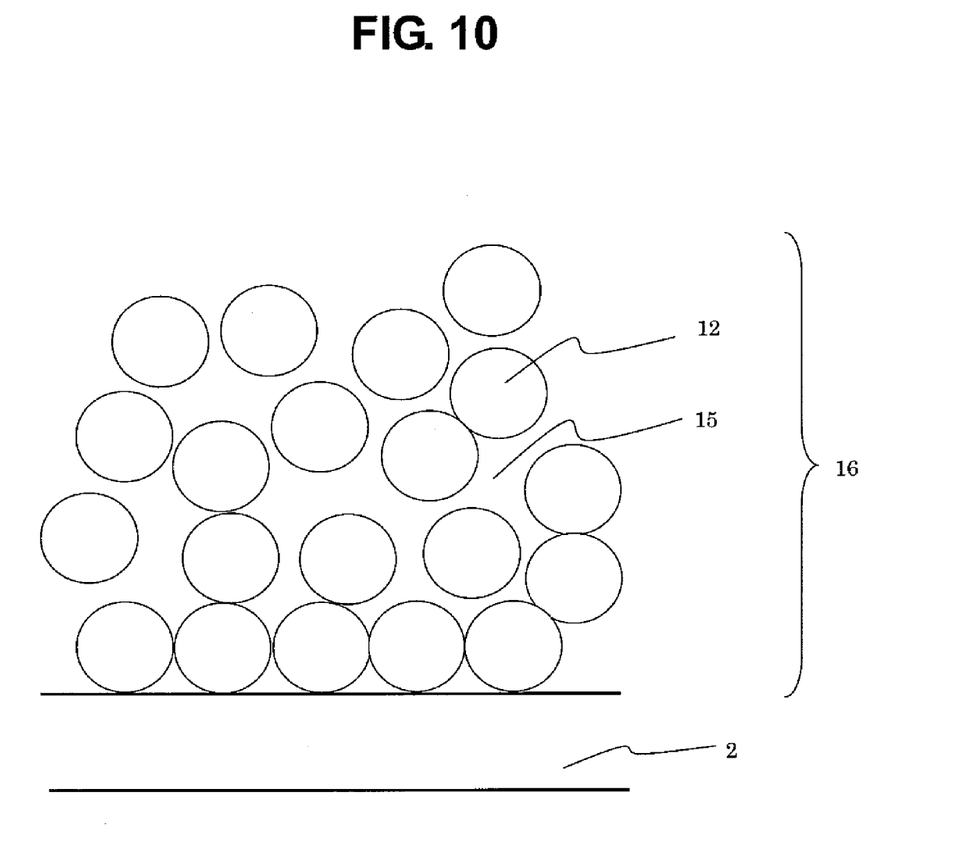
FIG. 10 is a partial sectional view illustrating a method of manufacturing a semiconductor device.
Figure 11:
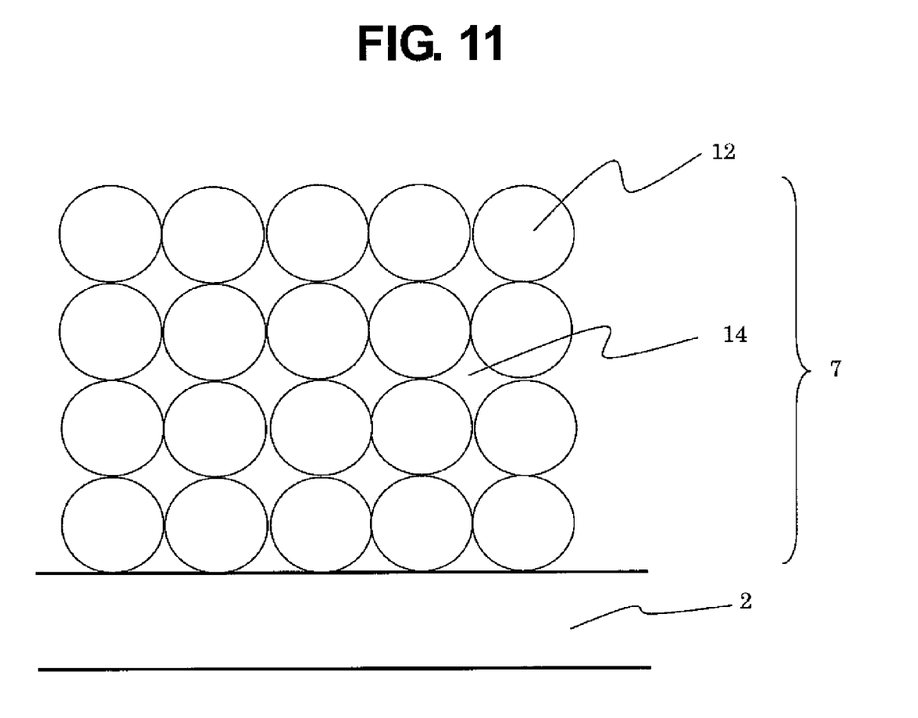
FIG. 11 is a partial sectional view illustrating a semiconductor device.
Figure 12:
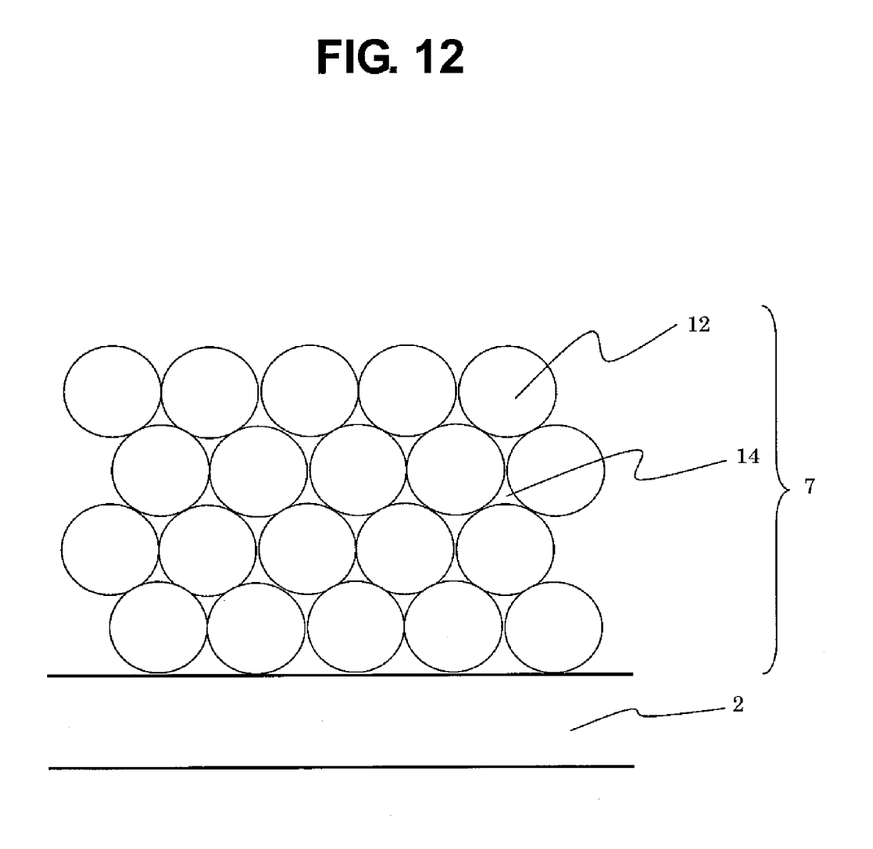
FIG. 12 is a partial sectional view illustrating a semiconductor device.

[Modification 9] FIGS. 10 to 14 are partial sectional views illustrating a film structure of the region of the porous metal film 7 of the semiconductor device according to the present invention, and a method of manufacturing the semiconductor device according to the present invention. FIG. 10 illustrates the insulating film 2 onto which conductive paste 16 is applied. The conductive paste is a liquid mixture containing a plurality of first metal nanoparticles 12 and an organic binder 15, and the metal nanoparticles 12 are dispersed in the liquid mixture. Since baking of the conductive paste causes decomposition of the organic binder, degassing in a vacuum atmosphere, as illustrated in FIGS. 11 and 12, enables bonding between the plurality of metal nanoparticles 12, forming inter-particle voids 14 among the particles. The porous metal film 7 including the metal nanoparticles and the inter-particle voids is thus formed. Here, the porous metal film 7 can be porous by being formed of at least two layers of upper and lower metal nanoparticle layers.

A metal film is deposited by a method such as sputtering on the porous metal film 7 which is formed as described above, and the metal film is patterned to form an electrode pad although the process is not shown as a drawing. Subsequently, the protective film is deposited by CVD and the like, and then the opening portion is provided. Further, wire-bonding is performed with respect to the opening portion, to thereby obtain the semiconductor device illustrated in FIG. 1.

Figure 13:
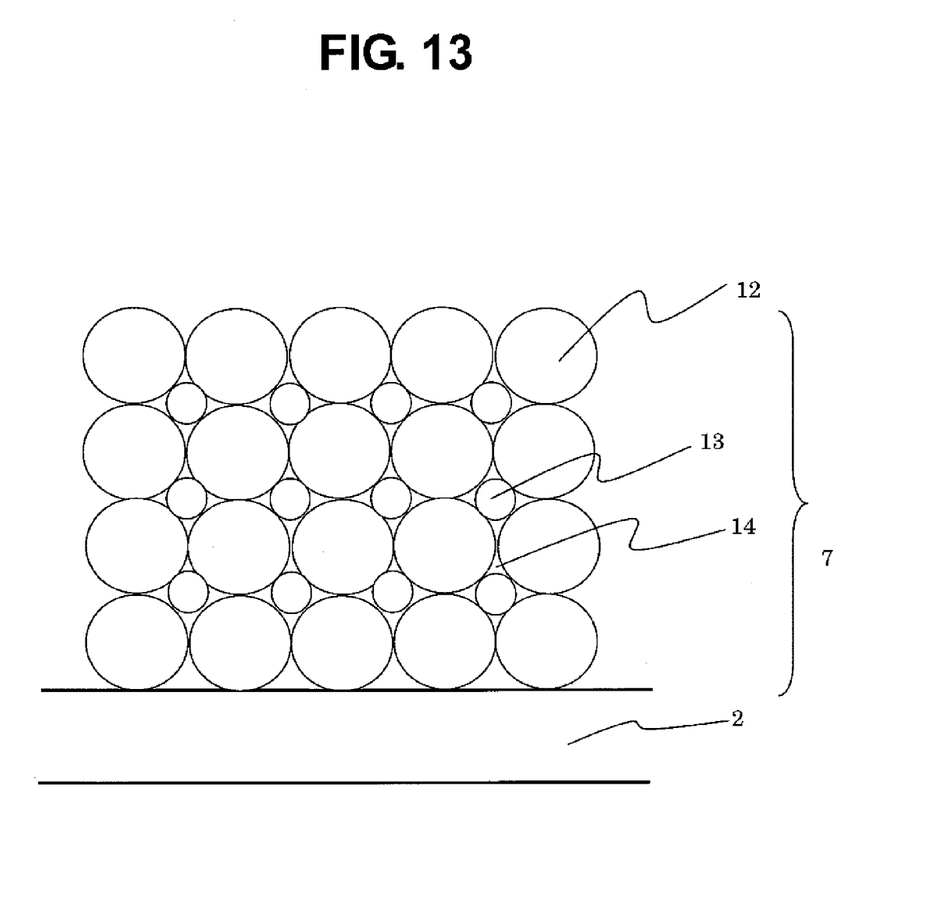
FIG. 13 is a partial sectional view illustrating a semiconductor device.
Figure 14:
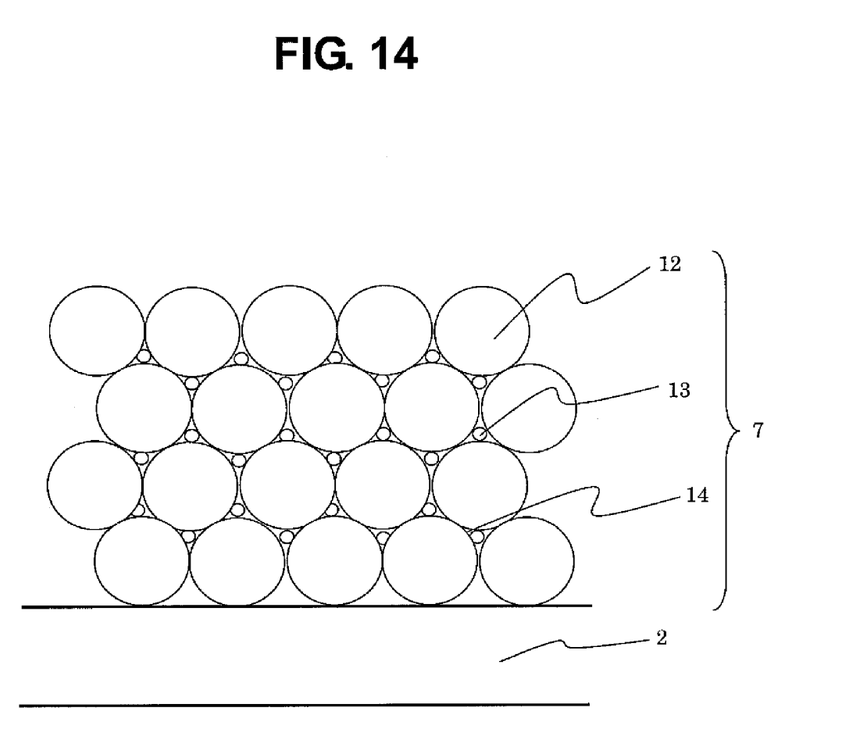
FIG. 14 is a partial sectional view illustrating a semiconductor device.

FIGS. 11 and 12 each illustrate the porous metal film formed with use of the conductive paste containing metal nanoparticles having a one-peak particle diameter (grain size) distribution, in which the particle diameter is substantially uniform, whereas FIGS. 13 and 14 each illustrate the porous metal film 7 formed from the conductive paste containing metal nanoparticles having a two-peak particle diameter distribution. Second metal nanoparticles 13 having a smaller particle diameter are arranged in contact with the first metal nanoparticles 12 having a larger particle diameter, and thus more interparticle voids 14 smaller than the interparticle voids illustrated in FIGS. 11 and 12 are formed. With the above-mentioned structure, the stress generated by the impact of the wire-bonding is more alleviated by the porous metal film. Further, with this structure, contact points among the metal particles increase, thereby achieving a finer electrode pad with a lower resistance.

Note that, when the arrangement as illustrated in FIG. 13 is to be obtained, the particle diameter of the second metal nanoparticles 13 is $(\sqrt{2}-1) \approx 0.41$ times the particle diameter of the first metal nanoparticles 12, and when the arrangement as illustrated in FIG. 14 is to be obtained, the particle diameter of the second metal nanoparticles 13 is $(2\sqrt{3}/3-1) \approx 0.15$ times the particle diameter of the first metal nanoparticles 12. The central value of the distribution of the particle diameter of the second metal nanoparticles is therefore desired to be between 0.41 and 0.45 times the particle diameter of the first metal nanoparticles in the arrangement of FIG. 13, and between 0.15 and 0.2 times the particle diameter of the first metal nanoparticles in the arrangement of FIG. 14 to have secure contact between the particles.

What is claimed is:
1. A semiconductor device, comprising:
a semiconductor substrate;

an insulating film disposed on a surface of the semiconductor substrate;

a porous metal film disposed on the insulating film, the porous metal film having a void region containing a plurality of voids and a void-free region that does not contain any voids;

a protective film disposed on the porous metal film, the protective film having an opening portion for defining a pad region having a pad opening end, and an interface between the void region and the void-free region of the porous metal film being disposed at one of the pad opening end and a position outside of the pad opening end; and a wire wire-bonded to the porous metal film in the pad region.

2. A semiconductor device according to claim 1, further comprising a metal film disposed between the porous metal film and the protective film.

3. A semiconductor device according to claim 1, further comprising a metal film disposed between the insulating film and the porous metal film.

4. A semiconductor device according to claim 1, further comprising a metal film provided between the porous metal film and the protective film, and wherein a region of the metal film is larger than a region of the porous metal film.

5. A semiconductor device according to claim 1, wherein the porous metal film comprises a plurality of metal nanoparticles and interparticle voids.

6. A semiconductor device according to claim 5, wherein the porous metal film is formed of at least two layers of upper and lower layers made of the plurality of metal nanoparticles.

7. A semiconductor device according to claim 6, wherein the plurality of metal nanoparticles comprise:

first metal nanoparticles having a first particle diameter; and second metal nanoparticles having a second particle diameter.

8. A semiconductor device according to claim 7, wherein a central value of a distribution of a particle diameter of the second metal nanoparticles is between 0.15 and 0.2 times the particle diameter of the first metal nanoparticles.

9. A semiconductor device according to claim 1, wherein the porous metal film is configured to absorb stress generated by an impact force applied to the pad region during wire-bonding of the wire to the porous metal film as a result of the plurality of voids in the void region of the porous metal film being crushed by the impact force.

10. A semiconductor device comprising:

a semiconductor substrate;

an insulating film disposed on a surface of the semiconductor substrate;

a protective film formed over the insulating film and having an opening portion defining a pad region to which a wire is bonded; and a porous metal film disposed on the insulating film and having a portion over which the protective film is disposed, the porous metal film having a plurality of crushed voids crushed during application of an impact force on the pad region when the wire is bonded to the pad region thereby avoiding the generation of cracks in the insulating film during wire bonding.

11. A semiconductor device according to claim 10, wherein the porous metal film includes a void region containing the plurality of voids and a void-free region that does not contain any void, an interface between the void region and the void-free region being disposed at one of an opening end of the pad region and a position outside of the opening end of the pad region.

12. A semiconductor device according to claim 10, further comprising a metal film disposed between the porous metal film and the protective film.

13. A semiconductor device according to claim 10, further comprising a metal film disposed between the insulating film and the porous metal film.

14. A semiconductor device according to claim 10, further comprising a metal film provided between the porous metal film and the protective film; and wherein a region of the metal film is larger than a region of the porous metal film.

15. A semiconductor device according to claim 10, wherein the porous metal film comprises a plurality of metal nanoparticles and interparticle voids.

16. A semiconductor device according to claim 15, the porous metal film is formed of a plurality of layers made of the plurality of metal nanoparticles.

17. A semiconductor device according to claim 16, wherein the plurality of metal nanoparticles comprise first metal nanoparticles having a first particle diameter and second metal nanoparticles having a second particle diameter different from the first particle diameter.

18. A semiconductor device according to claim 17, wherein the second particle diameter is between 0.15 and 0.2 times the first particle diameter.

\* \* \* \* \*